INVENTOR
REMO GALLETTI
BY
Kenyon & Kenyon
ATTORNEYS

May 4, 1965 R. GALLETTI 3,182,204

TUNNEL DIODE LOGIC CIRCUIT

Filed Nov. 16, 1961 2 Sheets-Sheet 2

INVENTOR.
REMO GALLETTI
BY Kenyon & Kenyon
ATTORNEYS

United States Patent Office 3,182,204
Patented May 4, 1965

3,182,204
TUNNEL DIODE LOGIC CIRCUIT

Remo Galletti, Milan, Italy, assignor to Ing. C. Olivetti & C., S.p.A., Ivrea, Italy, a corporation of Italy Filed Nov. 16, 1961, Ser. No. 152,725
Claims priority, application Italy, Nov. 24, 1960, 20,304/60
2 Claims. (Cl. 307—88.5)

The present invention relates to logic circuits using tunnel diodes.

In the electronic data processing and computing field logic circuits are known, which use tunnel diodes as bistable elements. More particularly, a known logic circuit comprises a tunnel diode having first and second voltage states, which diode is simultaneously fed with an excitation current and with a control current responsive to input signals, said diode being switched or not from said first state to said second state depending upon whether said control current is higher or not than a predetermined value.

It is also known that an inverter circuit may be obtained by connecting the series combination of a tunnel diode and a resistor across a constant voltage source.

By suitably combining an "or" gate with such an inverter circuit, a "nor" circuit is obtained, which is useful in that whatever logic function may be performed by properly interconnecting a plurality of like "nor" circuits.

However, a disadvantage of such a "nor" circuit resides in that it cannot be directly driven by the output of a preceding similar circuit.

According to my copending application Serial Number 127,537, filed July 28, 1961, such a disadvantage may be obviated by using in each stage of a logic network a pair of tunnel diodes having different peak currents. However, it would be desirable to reduce the number of tunnel diodes required.

Moreover, in a logic chain made of a plurality of known logic circuits, a three-phase power supply is required in order to control the direction of information flow through the chain. However, it would be desirable to reduce the number of phases of the power supply in order to simplify the required circuitry.

The object of the invention is to provide a logic circuit having a single tunnel diode.

Another object of the invention is to provide a logic circuit requiring a two-phase power supply.

According to the invention I provide a logic circuit comprising in combination: a tunnel diode having first and second voltage states, means for applying an excitation current to said diode, and means for selectively applying a control current pulse to said diode, said diode being switched from said first to said second state upon the concurrent application of said excitation current and said control current pulse, said pulse applying means comprising a pulse source, a gate connected between said source and said tunnel diode, and means selectively responsive to input signals for controlling said gate.

The novel features of the invention will become apparent from the following description of a preferred embodiment thereof, taken in conjunction with the accompanying drawing, in which.

Figure 3:
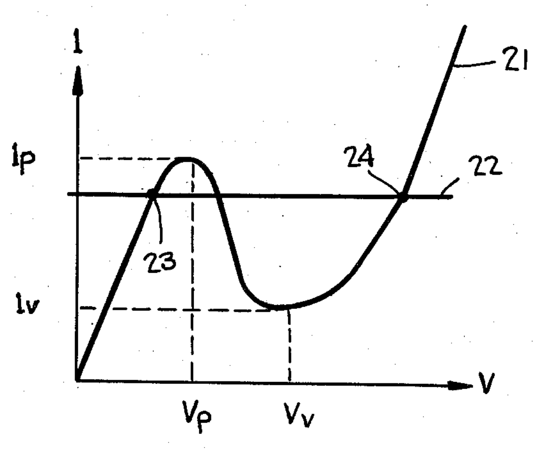
FIG. 3 shows the characteristic curve of a tunnel diode.

It is known in the art that, as shown in FIG. 3, the voltage-current characteristic 21 of a tunnel diode exhibits, in the direction of increasing voltages, a first region having a positive resistance, a second region having a negative resistance and a third region having a positive resistance, the coordinates of the point common to the first and the second region being the peak current $I_p$ and the peak voltage $V_p$ and the coordinates of the point common to the second and the third region being the valley current $I_v$ and the valley voltage $V_v$.

Figure 1:
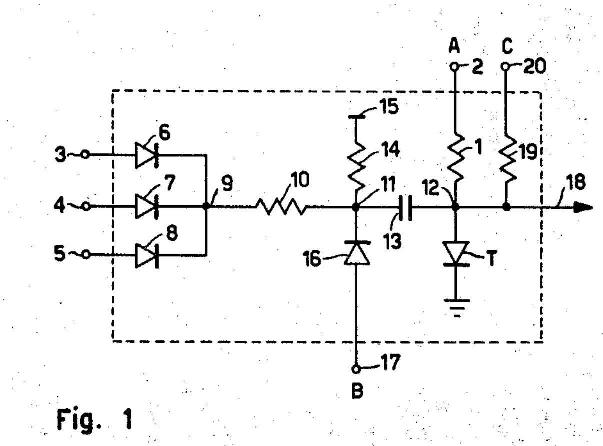
FIG. 1 shows an embodiment of the circuit according to the invention.

With reference to FIG. 1, the logical circuit according to the invention comprises a tunnel diode T having first and second voltage states. The diode T is connected in series with a resistance 1 having a terminal 2 connected to a source A of excitation current having an amplitude $+V_A$. FIG. 3 shows a load line 22 representing the voltage-current characteristic of the source A in series with the resistance 1.

Means are provided for selectively applying a control current pulse to the diode T. More particularly, a source of clock pulses B has its terminal 17 connected through a conventional diode 16 and a condenser 13 to the terminal 12 of the tunnel diode T.

The circuit is provided with three input terminals 3, 4, 5, which are connected through diodes 6, 7, 8, respectively, to a terminal 9 of a resistance 10, whose other terminal is connected to the junction point 11 between the diode 16 and the condenser 13.

Furthermore, said point 11 is connected through a resistance 14 to a point 15 having a fixed potential. The terminal 12 of the tunnel diode T is directly connected to the output terminal 18 of the circuit in order to derive the voltage of the tunnel diode as an output signal.

The resistance 10, the diode 16 and the condenser 13, which are star connected, form a gate connected between the source B and the terminal 12 of the tunnel diode T, said gate being selectively controlled by the input signals applied to the input terminals for being either inhibited or not, whereby the pulses B are selectively applied as control current pulses to the tunnel diode T. A source of reset pulses C, which is synchronized with the source B, has its terminal 20 connected to the terminal 12 of the tunnel diode T through a resistance 19.

The logical binary state "0" of the input and output signals is represented by a voltage level substantially not exceeding the peak voltage $V_p$ of the diode T, and the logical binary state "1" is represented by a voltage level substantially not lower than its valley voltage $V_v$. Furthermore, the diode T is said to be in its "0" or low voltage state when its voltage $V_T$ does not substantially exceed the peak voltage $V_p$, and to be in its "1" or high voltage state when its voltage is substantially not lower than the valley voltage $V_v$.

A suitable synchronizing apparatus not shown in the drawings produces a sequence of timing signals to control the cyclic operation of the logic circuit, each cycle comprising two consecutive phases $F_1$ and $F_2$. In each cycle (FIG. 2) the input signals are applied to the terminals 3, 4 and 5 only during the first phase $F_1$, and the output signal is obtained at the terminal 18 only during the second phase $F_2$.

The beginning of the second phase $F_2$ is determined by each one of the clock pulses produced by the source B, while the end of said second phase is determined by each one of the reset pulses produced by the source C.

The operation of the logic circuit will now be briefly described.

Figure 2:
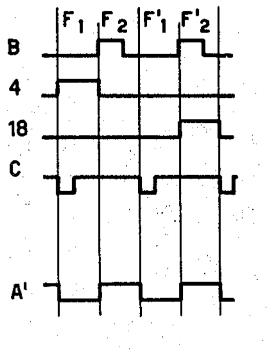
FIG. 2 shows the time diagram of some signals appearing in the circuit of FIG. 1.

Assuming that at the beginning of the first phase $F_1$ the tunnel diode T is in the state "0" (point 23 of FIG. 3) and the condenser 13 is not charged, and that one of the input signals which are applied during said phase $F_1$, e.g. the signal on the input 4, has the level "1" as indicated in FIG. 2, then during said first phase $F_1$ the condenser 13 is slowly charged through the diode 7, the resistance 10 and the tunnel diode T, thereby finally raising the terminal 11 to the voltage level "1" of the input signal. During this charging step the tunnel diode T does not switch to the state "1" because the current flowing through it is limited by the resistance 10.

At the beginning of the second phase $F_2$ a clock pulse B having an amplitude "1" is applied. As the point 11 is already at the voltage level "1," the diode 16 remains blocked, whereby the pulse B does not reach the tunnel diode T. Therefore, as the excitation current supplied by the source A is insufficient to switch by itself the tunnel diode, said tunnel diode remains in the state "0" also during the second phase $F_2$, whereby the output signal obtained at the output terminal 18 during said phase $F_2$ has the level "0."

At the end of the second phase $F_2$ a reset pulse is supplied by the source C in order to reset the tunnel diode to the state "0." In the present case, however, the tunnel diode was already in the state "0."

During the first phase $F_1'$ of the following cycle the input signals are applied to the respective input terminals 3, 4, 5. Assuming all said input signals have the level "0," then they do not charge the condenser 13. Before the end of said phase $F_1'$ the condenser will be discharged, for example through the resistance 14, whereby at the end of said phase the terminal 11 will have the voltage level "0."

Therefore, at the beginning of the second phase $F_2'$ the source B will produce through the diode 16 a current pulse which charges the condenser 13. Said current pulse flows through the tunnel diode T.

The amplitudes of said current pulse and of the excitation current are such that upon the concurrent application of said current pulse and the excitation current the tunnel diode switches from the state "0" to the state "1" (point 24 of FIG. 3). Therefore, during the phase $F_2'$ the tunnel diode T is in the state "1," until at the end of said phase it is restored to the state "0" by the reset pulse C, whereby an output signal having the level "1" is obtained on the output terminal 18 during said phase $F_2'$.

Summarizing, if during the first phase at least one input signal has the level "1," the output signal obtained during the second phase has the level "0"; if all the input signals have the level "0," the output signal has the level "1." Therefore, the logical NOR function is obtained.

Other logical functions may be obtained arranging the diode T in such a way as to cause it to be switched only in response to the presence of a predetermined combination of input signals.

It will thus be apparent that in the described logic circuit each input terminal 3, 4, 5 may be directly connected to the output terminal of a preceding circuit and that the output terminal 18 may be directly connected to an input terminal of one or more following circuits. Therefore, logic networks of a plurality of like logic circuts may be built up.

As in the described logic circuit the output signal is obtained during the phase which follows the phase during which the input signals are applied, the cycle of each logic circuit must be delayed one phase with respect to the cycle of the preceding circuit.

According to another embodiment of the present logic circuit the source of reset pulses C may be eliminated and the resetting of the tunnel diode may be obtained by arranging the source A to produce an excitation current which is interrupted during alternate phases, as shown in FIG. 2 with the reference letter A'.

From the foregoing description it will be understood that many changes may be made in the above circuit, and different embodiments of the invention could be made without departing from the scope thereof. It is, therefore, intended that all matter contained in the above description or shown in the accompanying drawings shall be interpreted as illustrative and not in a limiting sense.

What I claim is:

1. A logic "nor" circuit comprising in combination:
(a) a tunnel diode having first and second voltage states,
(b) means for applying an excitation current to said tunnel diode,
(c) and means for selectively applying a control current pulse to said tunnel diode,
(d) said tunnel diode being switched from said first to said second state upon the concurrent application of said excitation current and said control current pulse,
(e) said pulse applying means comprising a clock pulse source, a plurality of sources of input signals, a conventional diode, a condenser, said conventional diode and said condenser being connected in series between said clock pulse source and said tunnel diode, and means for connecting said source of input signals to the junction point between said conventional diode and said condenser, whereby in response to each input signal said condenser is charged to block said convenitonal diode.

2. A logic "nor" circuit comprising in combination:
(a) a tunnel diode having first and second voltage states,
(b) means for applying an excitation current to said tunnel diode,
(c) and means for selectively applying a control current pulse to said tunnel diode,
(d) said tunnel diode being switched from said first to said second state upon the concurrent application of said excitation current and said control current pulse,
(e) said pulse applying means comprising a source of clock pulses generated in alternate phases of a sequence of phases, a source of input signals operable in the remaining phases of said sequence, a conventional diode, a condenser, said conventional diode and said condenser being connected in series between said clock pulse source and said tunnel diode, and means for connecting said source of input signals to the junction point between said conventional diode and said condenser, whereby in response to each input signal said condenser is charged to block said conventional diode.

References Cited by the Examiner

UNITED STATES PATENTS

| | | | |
|---|---|---|---|
| 3,027,465 | 3/62 | Lorenzo et al. | 307—88.5 |
| 3,054,002 | 9/62 | Tendick | 307—88.5 |

OTHER REFERENCES

"Tunnel Diode Logic Circuits" by Chow, Electronics, June 24, 1960, pp. 103–107.

IBM Bulletin, vols. 2 and 6, p. 102, April 1960.

"Tunnel Diode Operation and Application," Lesk et al., pp. 270–277, Electrical Engineering.

"Transistor Electronics," by Lo et al., Prentice Hall, New Jersey, p. 472, TK7872–T73L6.

ARTHUR GAUSS, *Primary Examiner.*

JOHN W. HUCKERT, *Examiner.*